United States Patent
He et al.

(10) Patent No.: US 11,212,920 B2
(45) Date of Patent: Dec. 28, 2021

(54) PRESSING MEMBER AND MACHINE WITH PRESSING MEMBER

(71) Applicant: TRIPLE WIN TECHNOLOGY (SHENZHEN) CO. LTD., Shenzhen (CN)

(72) Inventors: Yu He, Jincheng (CN); Yan-Xin Feng, Jincheng (CN); Peng-Cheng Niu, Jincheng (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/953,065

(22) Filed: Nov. 19, 2020

(65) Prior Publication Data

US 2021/0185823 A1 Jun. 17, 2021

(30) Foreign Application Priority Data

Dec. 11, 2019 (CN) .......................... 201922216269.4

(51) Int. Cl.
*H05K 3/00* (2006.01)
*B32B 37/10* (2006.01)

(52) U.S. Cl.
CPC ....... *H05K 3/0014* (2013.01); *B32B 37/1009* (2013.01); *B32B 2457/08* (2013.01)

(58) Field of Classification Search
CPC .............. H05K 3/0014; B32B 37/1009; B32B 2457/08
See application file for complete search history.

(56) References Cited

U.S. PATENT DOCUMENTS

| 5,050,919 | A | * | 9/1991 | Yakou | .................. | B25J 15/0475 |
| | | | | | | 294/2 |
| 6,015,174 | A | * | 1/2000 | Raes | ..................... | B25J 15/0253 |
| | | | | | | 294/119.1 |
| 6,863,323 | B2 | * | 3/2005 | Neveu | .................. | B25J 15/0052 |
| | | | | | | 294/65 |
| 8,418,341 | B1 | * | 4/2013 | Fisher | .................. | B25J 15/0061 |
| | | | | | | 29/443 |

FOREIGN PATENT DOCUMENTS

EP 2 168 892 A1 * 3/2010

\* cited by examiner

*Primary Examiner* — Cynthia L Schaller
(74) *Attorney, Agent, or Firm* — ScienBiziP, P.C.

(57) ABSTRACT

A pressing member includes a base, a first pressing portion, and a second pressing portion. The first pressing portion and the second pressing portion are arranged on a same surface of the base. The base is provided with a first hole. The first pressing portion includes a first contact surface facing away from the base. The first contact surface defines a second hole extending toward the base and communicating with the first hole to cooperatively define a channel. The second pressing portion includes a second contact surface facing away from the base. The second contact surface and the first contact surface are arranged on a same plane.

11 Claims, 4 Drawing Sheets

PRESSING MEMBER AND MACHINE WITH PRESSING MEMBER

FIELD

The subject matter herein generally relates to the field of circuit board manufacturing, and more particularly to a pressing member and a machine having the pressing member.

BACKGROUND

During a manufacturing process of a circuit board, a preform of the circuit board generally needs to be bonded to a colloid and then cleaned by high-pressure cleaning, plasma cleaning, or other cleaning processes. However, the preform is generally pressed onto the colloid manually, but manual pressing is not uniform, and the preform may be warped or easily separated from the colloid due to uneven pressing. Furthermore, if the preform is a rigid-flex board, a flexible portion of the rigid-flex board may be lifted during the cleaning process and damaged.

BRIEF DESCRIPTION OF THE DRAWINGS

Implementations of the present disclosure will now be described, by way of embodiments, with reference to the attached figures.

DETAILED DESCRIPTION

Figure 1:
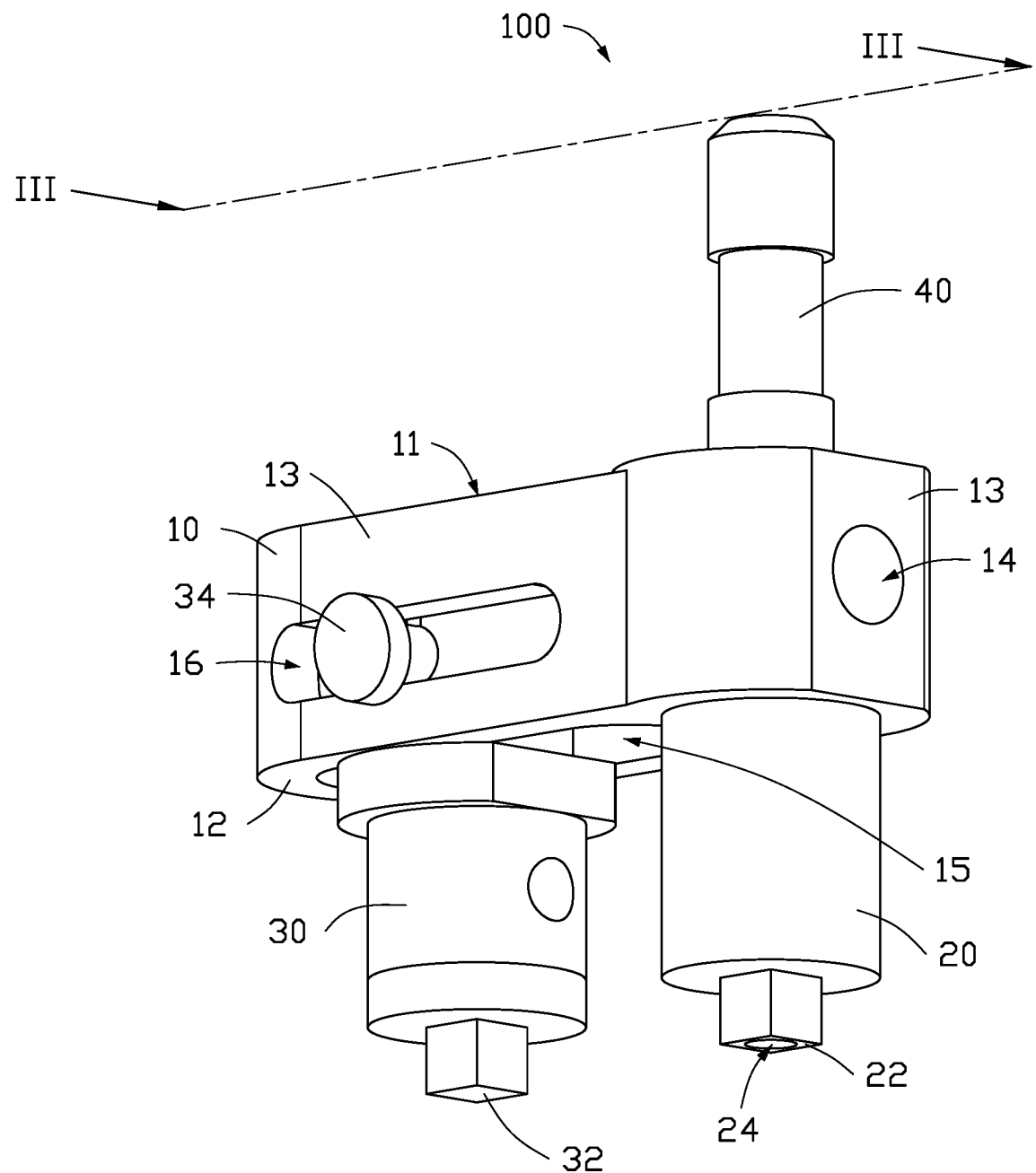
FIG. 1 is a schematic perspective diagram of an embodiment of a pressing member.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
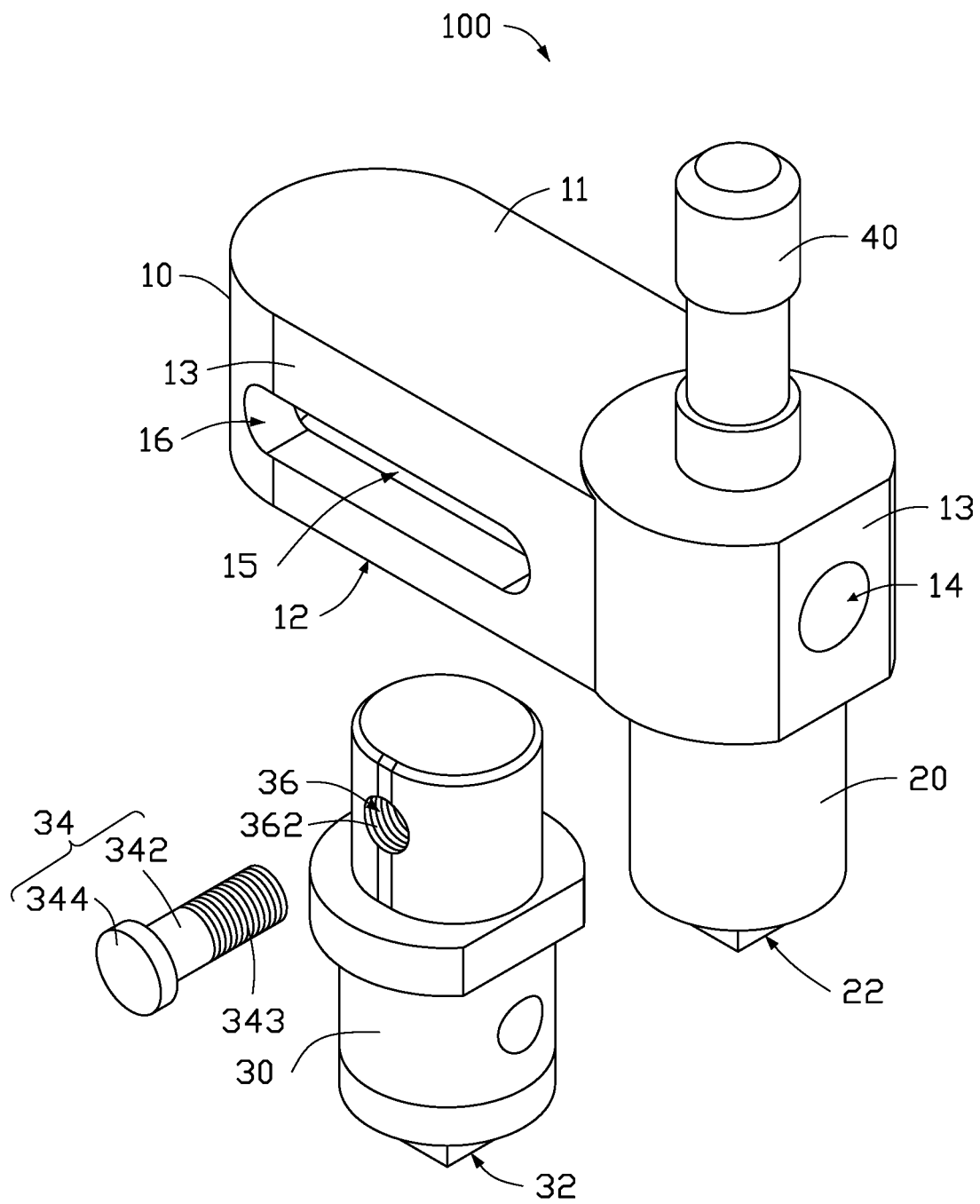
FIG. 2 is an exploded perspective diagram of the pressing member shown in FIG. 1.

FIGS. 1 and 2 show an embodiment of a pressing member 100 used for transferring a circuit board preform (not shown) during a manufacturing process of the circuit board and pressing the preform onto a colloid for subsequent cleaning of the preform.

The pressing member 100 includes a base 10, a first pressing portion 20, and a second pressing portion 30.

The base 10 is used to fix the first pressing portion 20 and the second pressing portion 30 together. In one embodiment, the base 10 is substantially a single piece and includes an upper surface 11 and a lower surface 12. The upper surface 11 and the lower surface 12 are opposite surfaces of the base 10. The base 10 further includes a side surface 13 substantially perpendicular to the upper surface 11 and the lower surface 12. In other embodiments, the base 10 may adopt other shapes as long as functions of the base 10 are fulfilled.

The upper surface 11 of the base 10 is provided with a mounting portion 40 for mounting the pressing member 100 by screwing, clamping, or other attachment means onto a machine base 200 (shown in FIG. 4), thereby obtaining a machine 300. The machine 300 is used to control the pressing member 100 to press the preform. In other embodiments, the mounting portion 40 can be arranged at any position of the base 10 as long as the functions of the base 10 are fulfilled.

Figure 3:
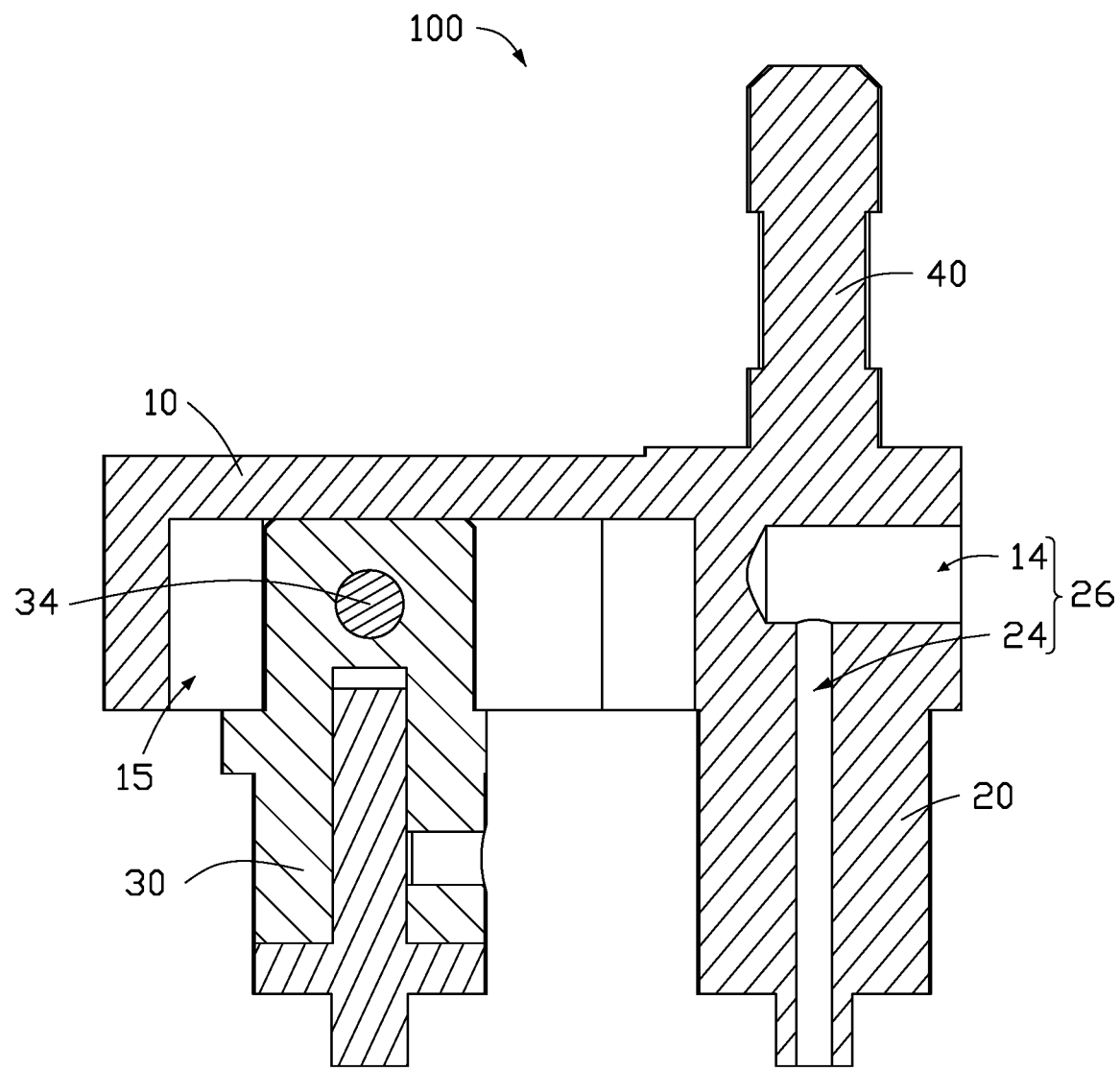
FIG. 3 is a cross-sectional diagram of the pressing member taken along line III-III in FIG. 1.

A first hole 14 is provided on the side surface 13 of the base 10 for communicating with a vacuum device 220 (shown in FIG. 4), such as a vacuum pump. The lower surface 12 of the base 10 is provided with a receiving groove 15, and the receiving groove 15 extends toward the upper surface 11 but does not penetrate the upper surface 11. The side surface 13 is provided with a guiding groove 16 extending along the side surface 13 toward the first pressing portion 20, and an extending direction of the guiding groove 16 is substantially perpendicular to an extending direction of the receiving groove 15. The guiding groove 16 penetrates the side surface 13 and communicates with the receiving groove 15 (shown in FIG. 3). The receiving groove 15 and the guiding groove 16 are isolated from the first hole 14. The receiving groove 15 is used for receiving the second pressing portion 30, and the guiding groove 16 is used for guiding the second pressing portion 30.

The first pressing portion 20 is fixedly arranged on the lower surface 12 of the base 10. The first pressing portion 20 includes a first contact surface 22 located on a surface of the first pressing portion 20 facing away from the base 10. The first pressing portion 20 is used to contact the preform. The first pressing portion 20 includes a second hole 24. The second hole 24 penetrates the first contact surface 22 and communicates with the first hole 14, and the first hole 14 and the second hole 24 cooperatively define a channel 26. The vacuum device 26 forms a vacuum through the channel 26, so that the first pressing portion 20 adheres to the preform and presses the preform onto the colloid.

The second pressing portion 30 is movably arranged in the guiding groove 16. A portion of the second pressing portion 30 is received in the receiving groove 15, and another portion of the second pressing portion 30 protrudes from the lower surface 12 of the base 10. A position of the second pressing portion 30 in the guiding groove 16 can be adjusted to adjust a distance between the second pressing portion 30 and the first pressing portion 20 according to actual needs.

The pressing member 100 further includes a screw 34 movably received through the guiding groove 16. An end of the screw 34 is fixed to the portion of the second pressing portion 30 received in the receiving groove 15. The second pressing portion 30 is fixed to the base 10 by the screw 34.

Specifically, the screw 34 is provided with a screw portion 342 and a resisting portion 344 coupled to the screw portion 342. A portion of the screw portion 342 away from the resisting portion 344 is provided with a first thread 343. A portion of the second pressing portion 30 received in the receiving groove 15 defines a third hole 36, and an inner wall of the third hole 36 is provided with a second thread 362 matching the first thread 343. The screw portion 342 is inserted into the guiding groove 16, the first thread 343 engages with the second thread 362, and the resisting portion 344 resists against the side surface 13, thereby fixing the second pressing portion 30 to the base 10.

The second pressing portion 30 includes a second contact surface 32 located on a surface of the second pressing portion 30 facing away from the base 10. The second contact surface 32 and the first contact surface 22 are arranged on a same plane, so that after the pressing member 100 uses the first pressing portion 20 to place the preform onto the colloid, the first pressing portion 20 and the second pressing portion 30 simultaneously press the preform to prevent the preform from being unevenly pressed and warped.

In one embodiment, the circuit board is a rigid-flex board, so the preform includes a flexible portion and a hard portion. The first pressing portion 20 first adheres the hard board portion, then the pressing member 100 places the preform onto the colloid and presses the preform onto the colloid. The first pressing portion 20 presses the rigid board portion, and the second pressing portion 30 presses the soft board portion, and the first pressing portion 20 and the second pressing portion 30 simultaneously press the preform to tightly bond the preform onto the colloid for subsequent processing.

In one embodiment, the distance between the second pressing portion 30 and the first pressing portion 20 is greater than or equal to 1 mm, which prevents the second pressing portion 30 from being too close to the first pressing portion 20.

Figure 4:
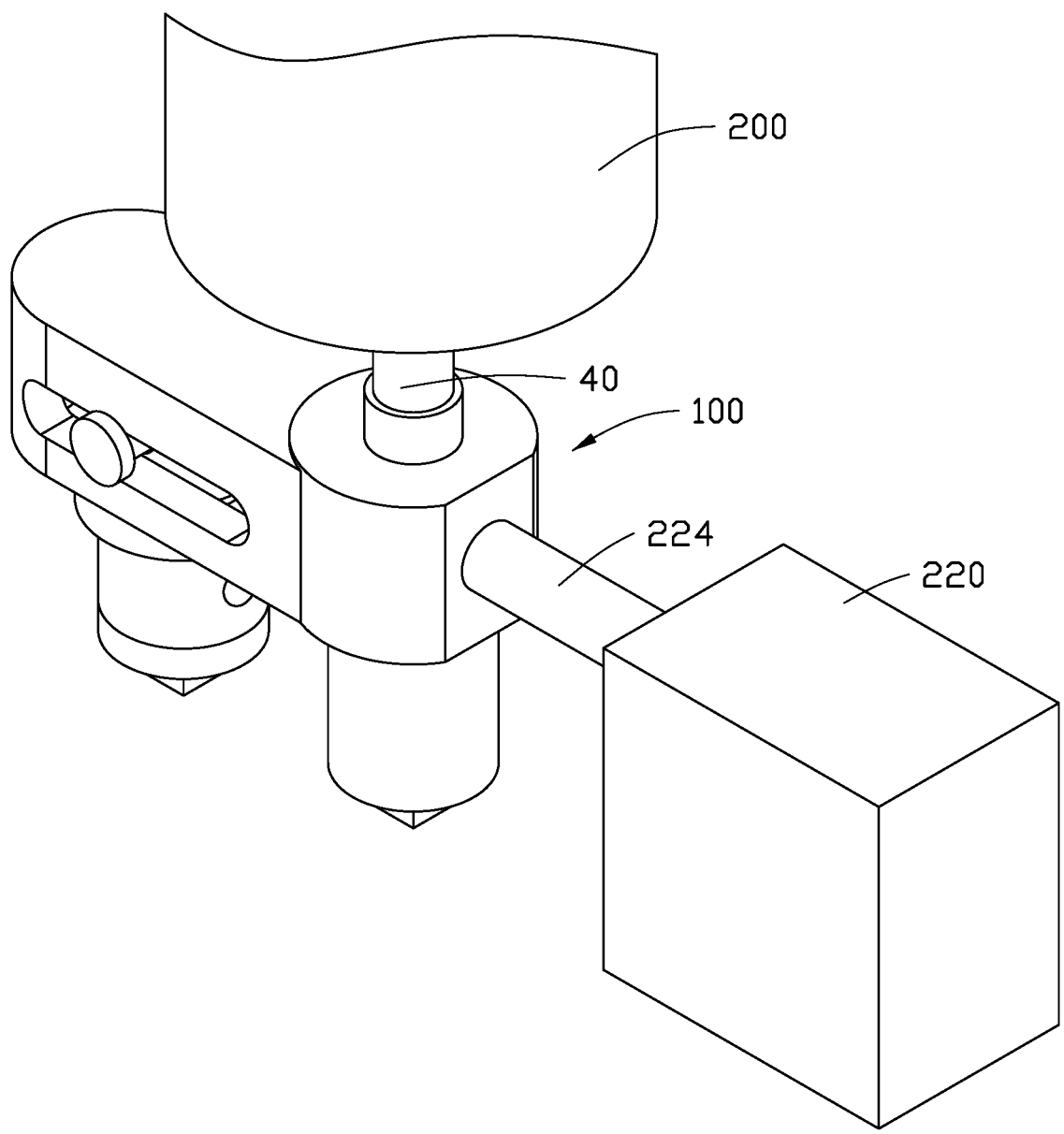
FIG. 4 is a partial schematic perspective diagram of an embodiment of a machine mounted to the pressing member.

Referring to FIG. 4, the machine 300 includes the machine base 200 and the pressing member 100 mounted to the machine base 200. The pressing member 100 is detachably mounted to the machine base 200, and the machine base 200 can control the pressing member 100 to adhere and press the preform.

The machine 300 further includes the vacuum device 220, which is arranged in the first hole 14 through a pipe 224, so as to communicate with the channel 26.

The pressing member 100 provided in this application is controlled by the machine 300 to control the pressing member 100 to press the preform instead of manual pressing, thereby avoiding the risk of damaging the preform and reducing the probability of scrapping the preform during a cleaning process. In addition, the machine 300 controls the pressing member 100 to press the preform with a uniform pressure, so that the force of manual pressing is not different from person to person, thereby reducing errors. The first pressing portion 20 and the second pressing portion 30 simultaneously press the preform, which helps prevent the preform from being unevenly pressed warped. At the same time, the channel 26 communicates with the vacuum device 220 to adhere the preform for placement onto the colloid. Operation of the pressing member 100 is simple and efficient, which saves labor costs.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A pressing member comprising:
   a base provided with a first hole;
   a first pressing portion arranged on a surface of the base, the first pressing portion comprising a first contact surface facing away from the base, the first contact surface defining a second hole extending toward the base and communicating with the first hole to cooperatively define a channel;
   a second pressing portion arranged on the surface of the base provided with the first pressing portion, the second pressing portion comprising a second contact surface facing away from the base, the second contact surface and the first contact surface arranged on a same plane;
   wherein the surface of the base provided with the second pressing portion is provided with a receiving groove;
   a portion of the second pressing portion is received in the receiving groove;
   the second contact surface protrudes from the receiving groove;
   the base comprises a side surface provided with a guiding groove extending along the side surface toward the first pressing portion;
   the second pressing portion is movably arranged in the guiding groove;
   an extension direction of the guiding groove is perpendicular to an extension direction of the receiving groove; and
   the guiding groove penetrates the side surface and communicates with the receiving groove.

2. The pressing member of claim 1, further comprising a screw, wherein:
   the screw comprises a screw portion and a resisting portion coupled to the screw portion;
   a portion of the screw portion away from the resisting portion is provided with a first thread;
   the portion of the second pressing portion received in the receiving groove is provided with a third hole, and an inner wall of the third hole is provided with a second thread matching the first thread; and
   the screw portion penetrates the guiding groove, the first thread engages with the second thread, and the resisting portion resists against the side surface.

3. The pressing member of claim 1 wherein:
   a distance between the first pressing portion and the second pressing portion is greater than or equal to 1 mm.

4. The pressing member of claim 1, further comprising a mounting portion, wherein:
   the mounting portion is arranged on the base.

5. The pressing member of claim 4, wherein:
   the mounting portion is provided on a surface of the base facing away from the surface of the base provided with the first pressing portion and the second pressing portion.

6. A machine comprising a pressing member, the pressing member comprising:

a base provided with a first hole;

a first pressing portion arranged on a surface of the base, the first pressing portion comprising a first contact surface facing away from the base, the first contact surface defining a second hole extending toward the base and communicating with the first hole to cooperatively define a channel;

a second pressing portion arranged on the surface of the base provided with the first pressing portion, the second pressing portion comprising a second contact surface facing away from the base, the second contact surface and the first contact surface arranged on a same plane;

wherein the surface of the base provided with the second pressing portion is provided with a receiving groove;

a portion of the second pressing portion is received in the receiving groove;

the second contact surface protrudes from the receiving groove;

the base comprises a side surface provided with a guiding groove extending along the side surface toward the first pressing portion;

the second pressing portion is movably arranged in the guiding groove;

an extension direction of the guiding groove is perpendicular to an extension direction of the receiving groove; and the guiding groove penetrates the side surface and communicates with the receiving groove.

7. The machine of claim 6, further comprising a screw, wherein:

the screw comprises a screw portion and a resisting portion coupled to the screw portion;

a portion of the screw portion away from the resisting portion is provided with a first thread;

the portion of the second pressing portion received in the receiving groove is provided with a third hole, and an inner wall of the third hole is provided with a second thread matching the first thread; and the screw portion penetrates the guiding groove, the first thread engages with the second thread, and the resisting portion resists against the side surface.

8. The machine of claim 7, wherein:

a distance between the first pressing portion and the second pressing portion is greater than or equal to 1 mm.

9. The machine of claim 8, further comprising a mounting portion, wherein:

the mounting portion is arranged on the base.

10. The machine of claim 9, wherein:

the mounting portion is provided on a surface of the base facing away from the surface of the base provided with the first pressing portion and the second pressing portion.

11. The machine of claim 10, further comprising a vacuum device coupled to the channel, wherein:

the vacuum device forms a vacuum in the channel.

\* \* \* \* \*